US008819604B2

(12) United States Patent
Ming

(10) Patent No.: US 8,819,604 B2
(45) Date of Patent: Aug. 26, 2014

(54) REAL-TIME DISPLAY OF ELECTRONIC DEVICE DESIGN CHANGES BETWEEN SCHEMATIC AND/OR PHYSICAL REPRESENTATION AND SIMPLIFIED PHYSICAL REPRESENTATION OF DESIGN

(71) Applicant: International Business Machines Corporation, Armonk, NY (US)

(72) Inventor: Jian Ming, Kanata (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/745,837

(22) Filed: Jan. 20, 2013

(65) Prior Publication Data

US 2014/0208281 A1    Jul. 24, 2014

(51) Int. Cl.
*G06F 17/50*    (2006.01)
(52) U.S. Cl.
USPC ............................................ 716/112; 716/110
(58) Field of Classification Search
USPC .................................................. 716/112–116
See application file for complete search history.

(56) References Cited

U.S. PATENT DOCUMENTS

| 5,109,479 | A | 4/1992 | Williams |
| 6,516,456 | B1 | 2/2003 | Garnett et al. |
| 6,866,148 | B2 | 3/2005 | You et al. |
| 7,073,149 | B2 | 7/2006 | Knol et al. |
| 7,530,046 | B1 * | 5/2009 | Nixon et al. ................ 716/103 |
| 7,793,249 | B1 | 9/2010 | Wadland et al. |
| 7,877,720 | B2 | 1/2011 | Staiger et al. |
| 8,006,219 | B2 | 8/2011 | Nishio et al. |
| 2006/0095882 | A1 * | 5/2006 | Mankin et al. ................ 716/11 |
| 2010/0199251 | A1 | 8/2010 | Potts et al. |

* cited by examiner

*Primary Examiner* — Binh Tat
(74) *Attorney, Agent, or Firm* — Feb Cabrasawan

(57)    ABSTRACT

A logical design component permits an electronic device design to be modified from a logical perspective on a schematic of the device showing device components in logical form, and displays a logical window of the schematic. A physical design component permits the design to be modified from a circuit board perspective on a circuit board representation of the device the showing the components in physical form, and displays a physical window of the circuit board representation. A real-time component permits the design to be modified from a simplified circuit board perspective on a simplified view of the circuit board representation, and displays a simplified window of the simplified view. Changes made to the design within the logical and/or physical window are automatically displayed within the simplified window in real-time; changes made to the design within the simplified window are automatically displayed within the logical and/or physical window in real-time.

19 Claims, 6 Drawing Sheets

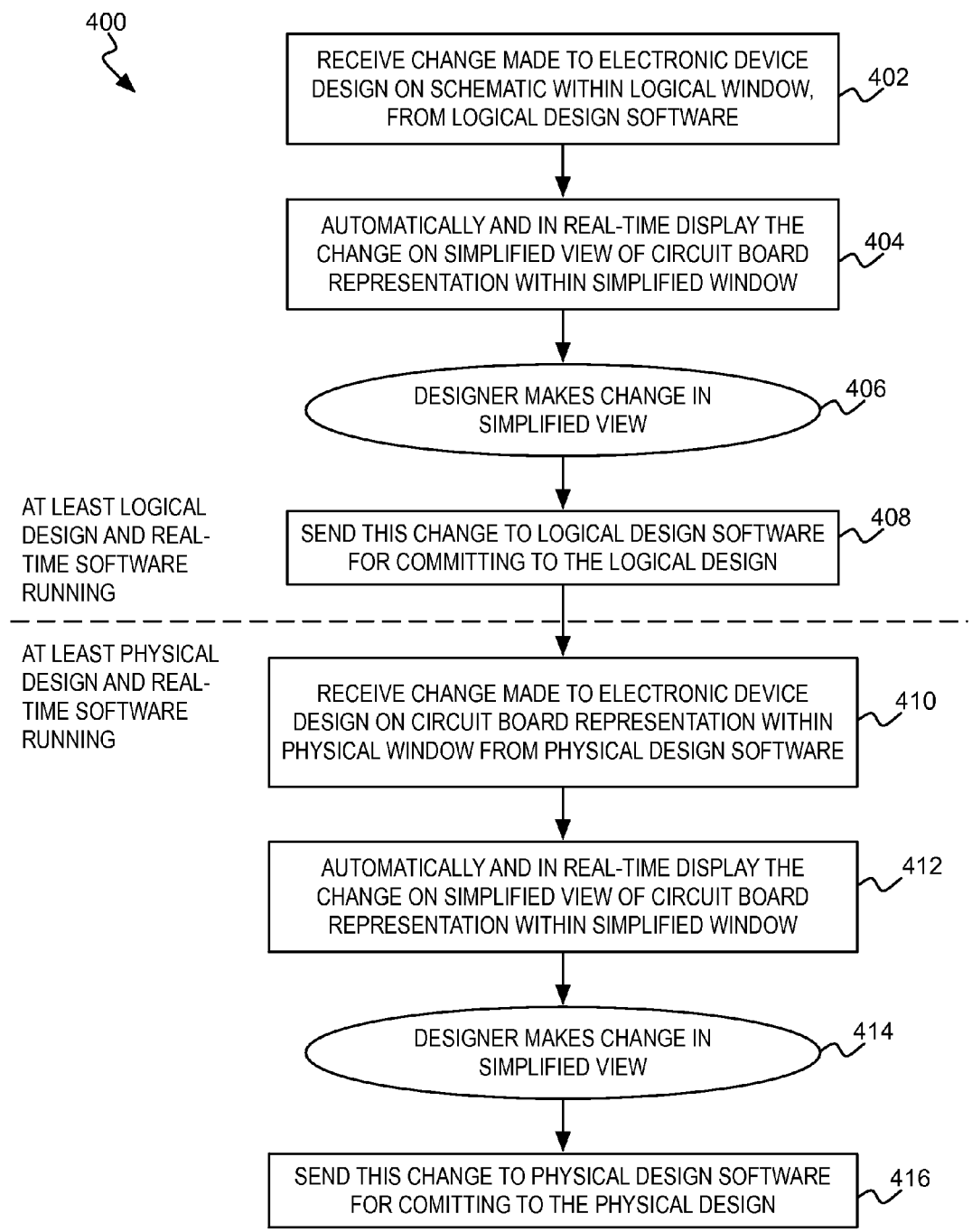

REAL-TIME DISPLAY OF ELECTRONIC DEVICE DESIGN CHANGES BETWEEN SCHEMATIC AND/OR PHYSICAL REPRESENTATION AND SIMPLIFIED PHYSICAL REPRESENTATION OF DESIGN

BACKGROUND

Electronic devices of all sorts, such as computing device, computing peripheral devices, consumer electronic devices, and other types of electronic devices, have to be designed. The design process can be an iterative process having two parts. The design of an electronic device is constructed logically on a schematic showing components of the device and connections therebetween in logical form irrespective of how the components are laid out on a circuit board. The design of the electronic device is constructed physically on a circuit board representation showing the components and connections therebetween in physical form as to be laid out on a circuit board. It is common for the logical design and the physical design of an electronic device to be performed by different users, who may be located in different cities, countries, or even continents.

SUMMARY

An example system of the disclosure includes hardware, including a processor, and a computer-readable data storage medium to store one or more computer programs executable by the hardware. The system includes one or more of a logical design component and a physical design component. The logical design component is implemented by the computer programs to permit a design of an electronic device to be modified from a logical perspective on a schematic of the electronic device showing components of the electronic device in logical form. The logical design component is to display a logical window of the schematic within which the design is modifiable.

The physical design component is implemented by the computer programs to permit the design of the electronic device to be modified from a circuit board perspective on a circuit board representation of the electronic device showing the components of the electronic device in physical form. The physical design component is to display a physical window of the circuit board representation within which the design is modifiable. As such, one or more windows of the logical window and the physical window are displayed.

The system includes a real-time component implemented by the computer programs to permit the design of the electronic device to be modified from a simplified circuit board perspective on a simplified view of the circuit board representation of the electronic device. The real-time component is to display a simplified window of the simplified view of the circuit board representation within which the design is modifiable. Changes made to the design of the electronic device within the one or more windows of the logical window and the physical window are automatically displayed within the simplified window in real-time, and changes made to the design within the simplified window are automatically displayed within the one or more windows in real-time.

An example computer program product of the disclosure includes a computer-readable storage medium having computer-readable code embodied therein, which is executable by a computing device. The computer-readable code includes one or more of first computer-readable code and second computer-readable code. The first computer-readable code is to receive from a logical design computer program a first change to a design of an electronic device made on a schematic of the electronic device within a logical window displayed by the logical design computer program and showing components of the electronic device in logical form. The first computer-readable code is to automatically and in real-time display the first change within a simplified window of a simplified view of a circuit board representation of the electronic device. The first computer-readable code is to send to the logical design computer program a second change to the design of the electronic device made on the simplified view of the circuit board representation within the simplified window.

The second computer-readable code is to receive from a physical design computer program a third change to the design of the electronic device made on the circuit board representation within a physical window displayed by the physical design computer program and showing the components of the electronic device in physical form. The second computer-readable code is to automatically and in real-time display the third change within the simplified window of the simplified view of the circuit board representation. The second computer-readable code is to send to the physical design computer program the second change to the design of the electronic device made on the simplified view of the circuit board representation within the simplified window.

An example method of the disclosure includes receiving a first change made to a design of an electronic device on a schematic of the electronic device within a logical window displayed by a logical design component and showing components of the electronic device in logical form, by a computing device. The example method includes automatically and in real-time displaying the first change within a simplified window of a simplified view of a circuit board representation of the electronic device, by the computing device. The example method includes sending to the logical design component a second change to the design of the electronic device made on the simplified view of the circuit board representation within the simplified window, by the computing device.

The example method can also include receiving a third change to the design of the electronic device made on the circuit board representation within a physical window displayed by a physical design component and showing the components of the electronic device in physical form, by the computing device. The example method can also include automatically and in real-time displaying the third change within the simplified window of the simplified view of the circuit board representation, by the computing device. The example method can also include sending to the physical design component a fourth change to the design of the electronic device made on the simplified view of the circuit board representation within the simplified window.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIG. 4 is a flowchart of an example method in which changes made to an electronic device design logically and/or physically are automatically displayed in real-time within a simplified window of a simplified view of a circuit board representation of the design, and vice-versa.

DETAILED DESCRIPTION

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure. Readers of the following detailed description should, therefore, not interpret the description in a limiting sense, and only the appended claims define the scope of the embodiment of the disclosure.

Figure 1:
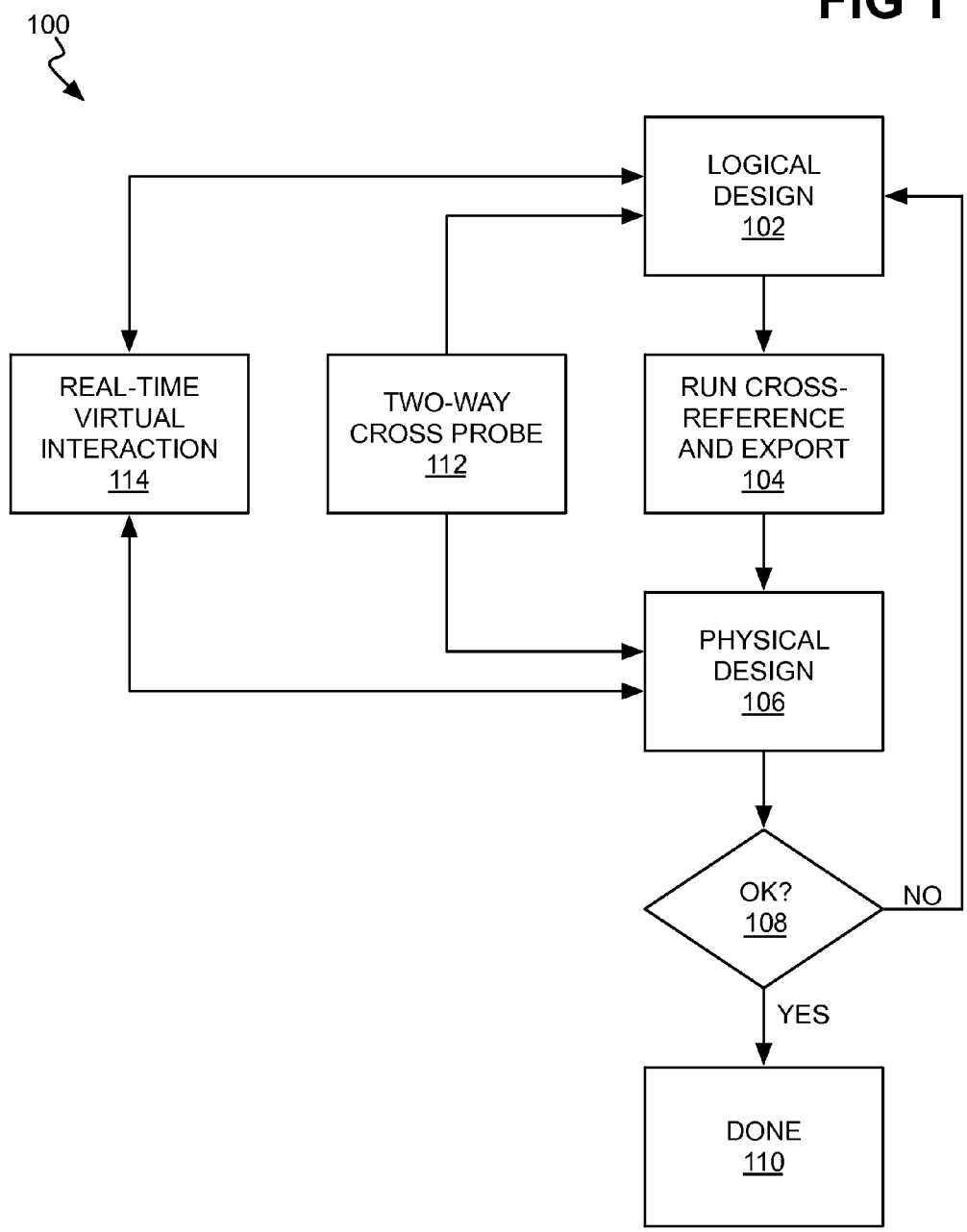
FIG. 1 is a diagram of an overview of an example electronic device design process in which changes made to the design logically and/or physically are automatically displayed in real-time within a simplified window of a simplified view of a circuit board representation of the design, and vice-versa.

FIG. 1 shows an example design process 100 for an electronic device. Conventionally, the process 100 starts with a logical designer or another user designing the electronic device from a logical perspective on a schematic of the electronic device (102). The schematic shows components of the electronic device in logical form, and connections among these components. A schematic, or schematic diagram, represents the elements of an electronic device using abstract, graphic symbols rather than realistic pictures. The layout of the symbols need not resemble the actual physical layout of the electronic device on a printed circuit board, but rather are typically arranged to be more easily interpreted by a viewer.

In general, specialized logical design software is employed by the logical designer to complete the design for the electronic device from a logical perspective on the schematic. Once the logical designer has completed at least a first run of the design, the software may run a cross-reference among the connections to ensure that they are logically viable, and export a version of the design that can be read by different software (104). This different software can be physical design software that is employed by a physical designer to layout the actual circuit board to realize the design for the electronic device. The physical designer is a user who can be and typically is different than the logical designer.

The process 100 therefore includes the physical designer or another user designing the electronic device from a circuit board perspective on a circuit board representation of the electronic device (106). The circuit board representation shows the components of the electronic device in physical form, and connections among these components. The circuit board representation shows where these components are actually located on the printed circuit board, and shows how the components are actually interconnected via traces on the printed circuit board. That is, the actual locations of such traces are included within the circuit board representation. If the physical design is satisfactory (108), then the process 100 is finished (110); otherwise, this two-part logical and physical design process can be iterated be repeating at part 102.

The design of the electronic device is created and modified from a logical perspective in part 102 in that the components to realize the functionality of the electronic device are chosen, and how these components are interconnected to realize this functionality is determined. By comparison, the design of the electronic device is created and modified from a circuit board perspective in part 106 in that how and where the components are actually laid out on a circuit board is determined, as well as how interconnections between these components are realized with traces, and where these traces are located on the circuit board, is determined. In general, the logical designer does not concern him or herself with the circuit board layout issues of the physical design, and the physical designer does not concern him or herself with the functionality issues of the logical design.

A difficulty with the iterative process of parts 102 and 106 is that the logical designer cannot see corresponding changes in the circuit board representation of the electronic device when making changes in the schematic of the electronic device in part 102. Likewise, the physical designer cannot see corresponding changes in the schematic of the electronic device when making changes in the circuit board representation of the electronic device in part 106. As such, even simple errors in part 102 or part 106 can result in one or more iterations to correct.

As one example, a logical designer may have a variety of different output pins of an electronic component to choose from to connect to a desired input pin of another electronic component. The logical designer may thus choose output pins in an arbitrary order on the schematic. When the physical designer attempts to realize this design on the circuit board representation, however, he or she may realize that the chosen connections require physical complexities or even impossibilities, such as crossing trace lines. The physical designer may thus request that the logical designer choose different output pins, which the logical designer could have done in the beginning if he or she had known that such errors would result from his or her initial choices.

Conventionally, two-way cross probing (112) has been proposed that ameliorates some of these difficulties. Two-way cross probing can permit designers to see a corresponding pin on the circuit board representation for a selected pin on the schematic. Two-way cross probing can also permit designers to see a corresponding pin on the schematic for a selected pin on the circuit board representation. However, two-way cross probing is quite limited.

Two-way cross probing cannot even be employed until at least one iteration of both parts 102 and 106 has been completed. As such, the initial logical design of the electronic device cannot benefit from this cross probing. Furthermore, if during the logical design of part 102 the logical designer adds or removes components from the design, complete two-way cross probing may not be able to be employed until the physical designer has updated the physical design in part 106. For example, components added to the schematic cannot be cross-probed during the logical design in part 102 until they have correspondingly been added to the circuit board representation in part 106.

Innovatively, then, disclosed herein are techniques to provide real-time virtual interaction (114) between the logical design of part 102 and the physical design of part 106. In particular, this real-time interaction shows a simplified view of the circuit board representation of the electronic device. Changes made to the design of the electronic device within the schematic in part 102 are automatically made to this simplified view, and likewise changes made to the design within the circuit board representation in part 106 are automatically made to this simplified view and displayed in real-time.

The simplified view permits the design to be modified from a simplified circuit board perspective as well, and such changes made to the design within the simplified view are automatically made and display in real-time during the logical design of part 102 and/or during the physical design of part 106. The real-time virtual interaction is in real-time. The real-time virtual interaction is virtual in that changes made to the schematic during the logical design of part 102 are not in actuality automatically made to the circuit board representation, but rather are just virtually depicted in the simplified view of the circuit board representation. The circuit board representation still has to be updated during the physical design of part 106.

Figure 2:
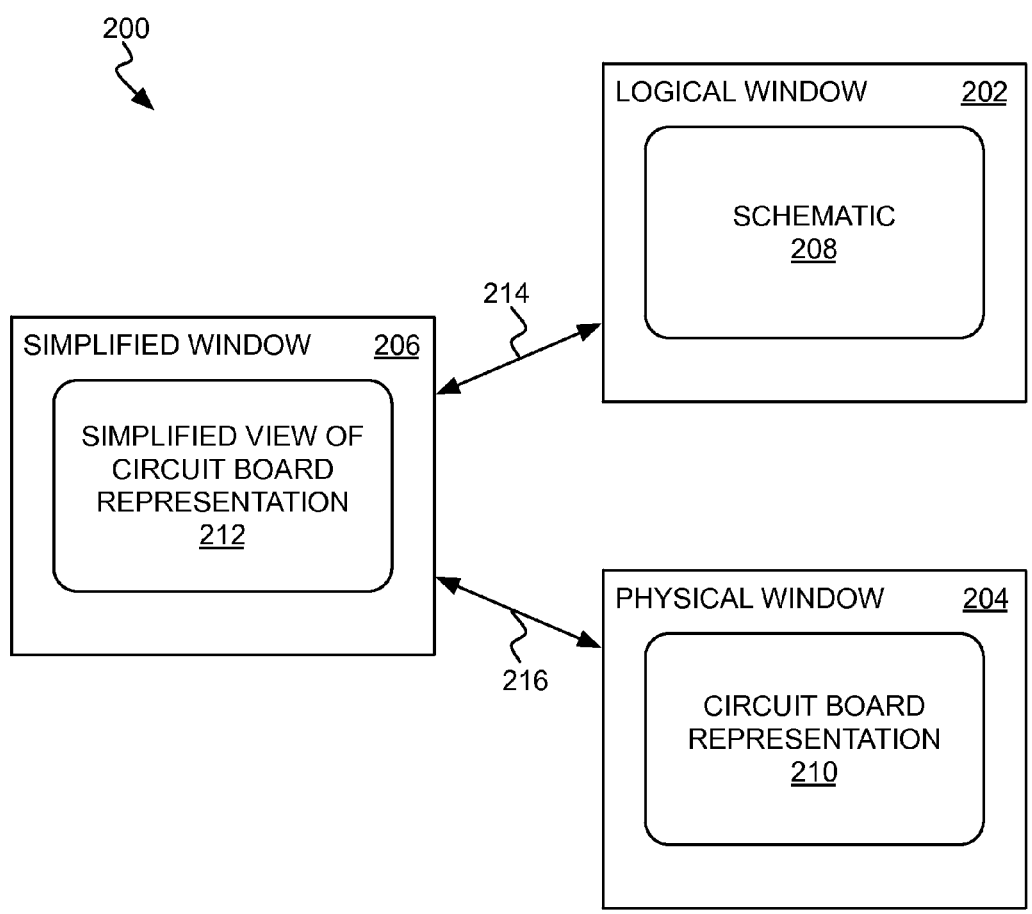
FIG. 2 is a diagram of an example simplified window of a simplified view of a circuit board representation of an electronic device design and how changes made to the design therein can be automatically displayed in real-time within a logical window of a schematic of the design and/or within a physical window of the circuit board representation of the design, and vice-versa.

FIG. 2 shows a logical window 202, a physical window 204, and a simplified window 206. The terms logical, physical, and simplified as adjectives modifying the term window are used just to distinguish among the windows 202, 204, and 206. Of the logical window 202 and the physical window 204, just window 202 or 204 may be displayed.

Logical design software, such as a logic design component implemented by a computer program, displays a schematic 208 for a design of an electronic device within the logical window 202. The logical design software permits the design to be modified from a logical perspective on the schematic 208 within the logical window 202. Physical design software, such as a physical design component implemented by a computer program, displays a circuit board representation 210 for the design of the electronic device within the physical window 204. The physical software permits the design to be modified from a physical perspective on the circuit board representation 210 within the physical window 204.

Real-time software, such as a real-time component implemented by a computer program, displays a simplified view 212 of the circuit board representation within the simplified window 206. The real-time software permits the design of the electronic device to be modified from a simplified circuit board perspective on the simplified view 212 within the simplified window 206. The simplified circuit board perspective is like the circuit board perspective that has been described, in that changes can be made on a circuit board representation of the design, albeit a simplified view 212 thereof.

However, when the logical design software and the real-time software are communicating with one another, and the physical design software and the real-time software are not communicating with one another, changes made from the simplified perspective on the simplified view 212 do not result in actual changes being made to the physical design of the electronic device (i.e., the circuit board representation 210). Rather, actual changes to the physical design are still made just within the circuit board representation 210 (or the schematic 208) using the physical design software. The changes made to the simplified view 212 within the simplified window 206 using the real-time software are virtual in this respect and in this case. Furthermore, because the simplified view 212 is simpler than the circuit board representation 210, the full gamut of changes that can be made within the latter may not be able to be made within the former.

The circuit board representation 210 displayed within the physical window 204 is typically a two-dimensional representation of the physical design of the electronic device in a computer-aided drawing (CAD)-like view. The simplified view 212 displayed within the simplified window 206 can likewise be a two-dimensional representation, albeit not including all the information that the actual circuit board representation 210 includes, as noted above. However, the simplified view 212 may be a three-dimensional representation instead, showing, for instance, the components of the electronic device design in three-dimensional form. This can be beneficial for components like stacked connectors that are difficult to display in just two dimensions. A user may be able to switch between the simplified view 212 being two-dimensional and the view 212 being three-dimensional in some implementations.

Changes made to the design of the electronic device from the logical perspective on the schematic 208 within the logical window 202 are automatically displayed on the simplified view 212 within the simplified window 206 in real-time. Likewise, (virtual) changes made to the design from the simplified circuit board perspective on the simplified view 212 within the simplified window 206 are automatically made (and displayed on) the schematic 208 within the logical window 202 in real-time, when the logical window 202 is currently being displayed. The bi-directional arrow 214 indicates this functionality in FIG. 2. Changes made to the design on the schematic 208 within the logical window 202 are not automatically made and displayed on the actual circuit board representation 210 within the physical window 204 in real-time, however, even if both windows 202 and 204 are currently being displayed.

Changes made to the design of the electronic device from the circuit board perspective on the circuit board representation 210 within the physical window 204 are automatically displayed on the simplified view 212 within the simplified window 206 in real-time. Likewise, (virtual) changes made to the design from the simplified circuit board perspective on the simplified view 212 within the simplified window 206 are automatically made (and displayed on) the circuit board representation 210 within the physical window 204 in real-time, when the physical window 204 is currently being displayed. The bi-directional arrow 216 indicates this functionality in FIG. 2. Changes made to the design on the circuit board representation 210 within the physical window 204 are not automatically made and displayed on the schematic 208 within the logical window 202 in real-time, however, even if both windows 202 and 204 are currently being displayed.

In this respect, it is noted that the design of an electronic device in actuality includes two parts: the logical design as to which components are present and how these components are interconnected to realize the desired functionality of the device, and the physical design as to how these components and traces representing the interconnections therebetween are laid out on a circuit board. As has been described above, the logical design can impact the physical design, and vice-versa. Hence, the virtual interactivity provided by the simplified view 212 of the circuit board representation is helpful in assessing these impacts in real-time.

For instance, if a pin of an electronic component is selected on the schematic 208 within the logical window 202, the corresponding pin of the corresponding pin is automatically selected on the simplified view 212 of the circuit board representation within the simplified window 206 in real-time, and vice-versa. That is, selection of a pin on the simplified view 212 automatically results in the corresponding pin being selected on the schematic 208. Likewise, if a logical connection is made between two components on the schematic 208 within the logical window 202, what is known as a rat line is correspondingly displayed between these two components on the simplified view 212 within the simplified window 206 in real-time, and vice-versa. That is, selection of a rat line on the simplified view 212 automatically results in the corresponding logical connection being displayed on the schematic 208. These differing functionalities permit the logical designer using the logical design software to see how decision made during the logical design of the electronic device may impact the physical design of the electronic device.

A rat line may in some scenarios be considered as a logical connection within the schematic 208 of the design of an electronic device that has not yet been realized as an actual physical connection (i.e., a conductive trace) within the circuit board representation 210 of the design of the electronic device. Furthermore, the shapes of rat lines displayed within the simplified view 212 on the simplified window 206 may be modifiable in real-time. This permits the logical designer to correct trace crossing and other issues that may subsequently manifest themselves within the circuit board representation 210. The logical designer may thus save the simplified view 212 being displayed within the simplified window 206 while he or she is modifying the design of the electronic device within the schematic 208, for subsequent reference by the physical designer when the physical designer is correspondingly working on the design within the circuit board representation 210.

That is, the saving of the simplified view 212 can act as a mechanism between the logical designer and the physical designer to communicate information that is otherwise hard to describe using just words, and thus may otherwise require the logical designer to draw rough sketches manually. The physical designer may thus reference the saved simplified view 212 while working on the circuit board representation 210 to determine the logical designer's intent or desire. For instance, the physical designer may reference such a saved simplified view 212 to determine how to route traces on the circuit board representation 210 in correspondence with the rat lines of the simplified 212, the shapes of which as may have been modified by the logical designer.

Figure 3A:
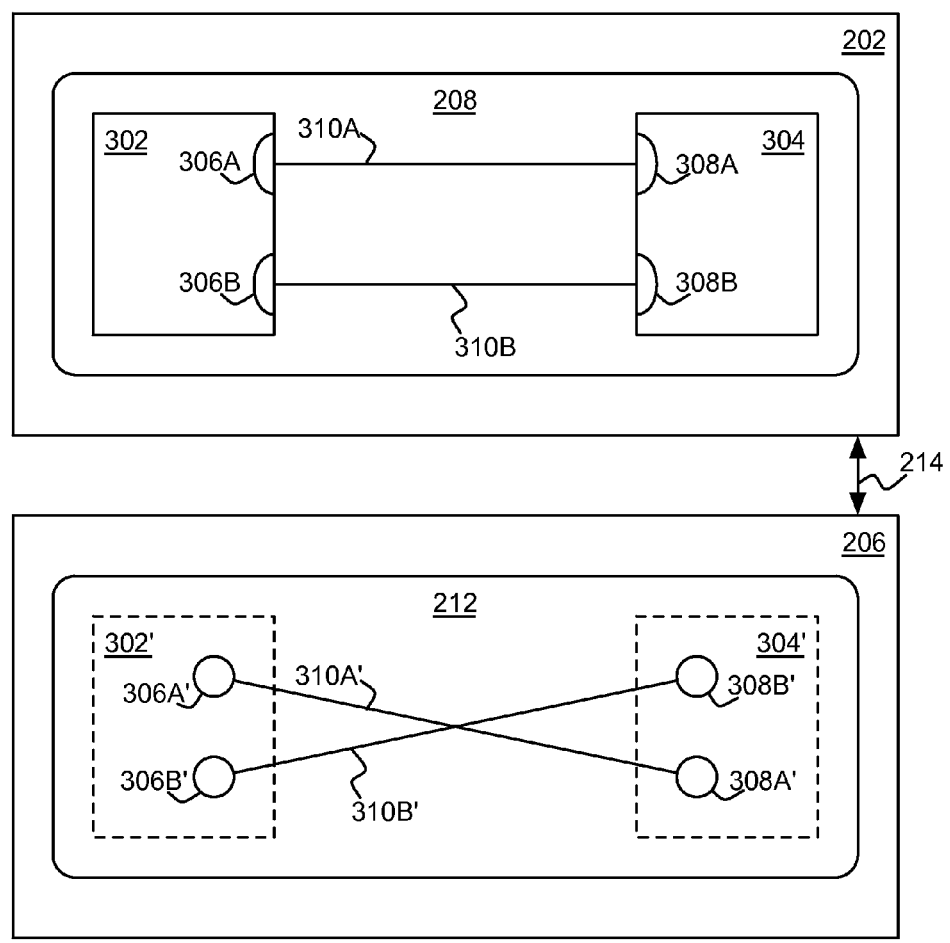
FIGS. 3A and 3B are diagrams depicting example changes made to an electronic device design being automatically displayed in real-time between a simplified window of a simplified view of a circuit board representation of an electronic device design and a logical window of a schematic of the design.
Figure 3B:
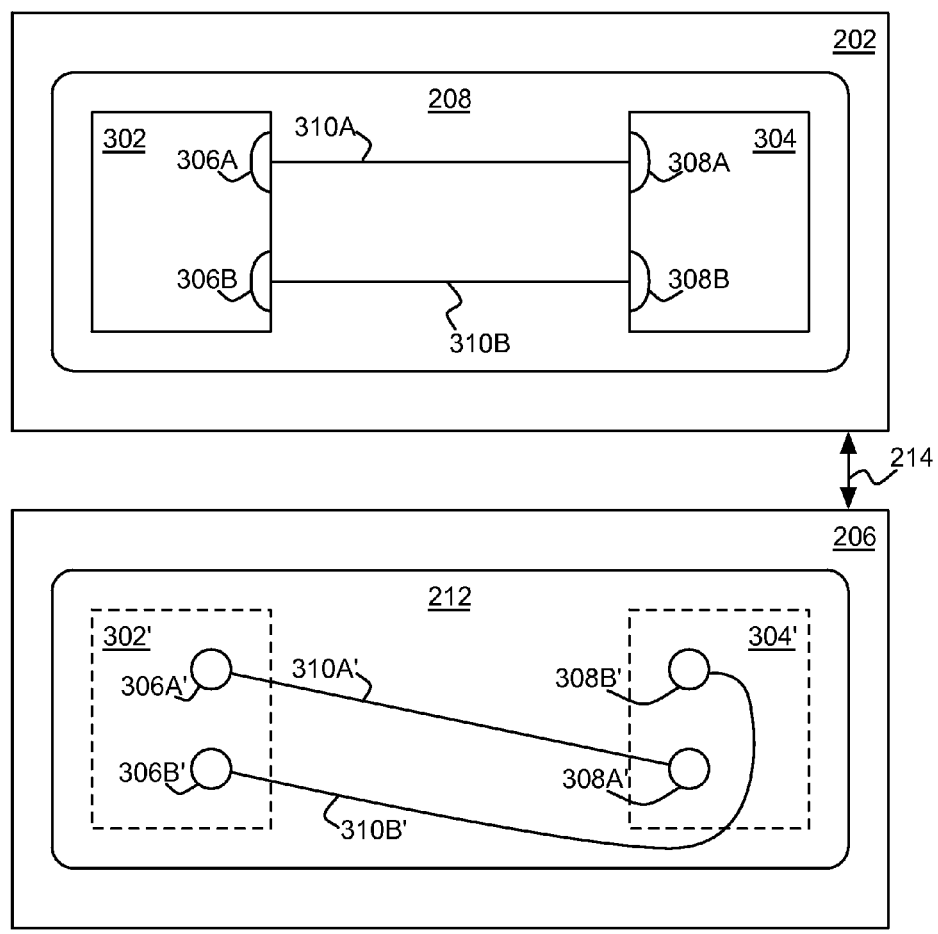

FIGS. 3A and 3B show rudimentary examples of how the simplified view 212 of the simplified window 206 can assist the logical designer when designing an electronic device on the schematic 208 of the logical window 202 via automatic and real-time mirroring of changes as represented by the bi-directional arrow 214 in both figures. In FIG. 3A, the schematic 208 of the logical window 202 includes two components 302 and 304. The component 302 includes output pins 306A and 306B, which are collectively referred to as the output pins 306, and the component 304 includes input pins 308A and 308B, which are collectively referred to as the input pins 308.

The logical designer has made a logical connection 310A between the output pin 306A of the component 302 and the input pin 308A of the component 304, and has made a logical connection 310B between the output pin 306B and the input pin 308B. The logical connections 310A and 310B are collectively referred to as the logical connections 310. The logical designer has thus selected the output pins 306, the input pins 308, and then has made the logical connections 310 between the output pins 306 and the input pins 308 on the schematic 208 of the logical window 202.

Therefore, the simplified view 212 of the circuit board representation within the simplified window 206 automatically and in real-time displays output pins 306A' and 306B' of the component 302', which are collectively referred to as the output pins 306A'. The component 302' corresponds in physical form to the component 302, which is the logical form of the same component. The output pins 306' likewise correspond to the selected output pins 306. Similarly, the simplified view 212 automatically and in real-time displays input pins 308A' and 308B' of the component 304', which are collectively referred to as the input pins 308'. The component 304' corresponds in physical form to the component 304, which is the logical form of the same component, and the input pins 308' likewise correspond to the selected input pins 308.

The simplified view 212 of the simplified window 206 also automatically and in real-time displays the changes made to the design of the electronic device within the schematic 208 of the logical window 202. Specifically, the simplified view 212 automatically and in real-time displays rat lines 310A' and 310B', which correspond to the logical connections 310. The rat lines 310A' and 310B' are collectively referred to as the rat lines 310'.

The actual physical locations of the input pins 308' on the circuit board representation are reversed in order as compared to their corresponding input pins 308 as depicted in the schematic 208. This fact may not be known to the logical designer a priori. The importance of which output pin 306A or 306B connects to which input pin 308A or 308B may be negligible at best, and therefore the logical designer may have just arbitrarily connected the output pin 306A to the input pin 308A and the output pin 306B to the input pin 308B within the schematic 208 of the logical window 202. However, the consequences of this arbitrary decision result in a problem in the physical layout of the design for the electronic device, which is not readily apparent by inspecting just the schematic 208.

Specifically, as the logical designer can easily glean by viewing the simplified view 212 of the circuit board representation within the simplified window 206, connecting the output pins 306 to the input pins 308 as described above results in the rat lines 310' corresponding to the logical connections 310 crossing one another. This is because the actual physical input pins 308' are reversed in order as compared to their corresponding input pins 308. Because the rat lines 310A' are added to the simplified view 212 automatically and in real-time as the logical designer adds their corresponding logical connections 310 to the schematic 208, the logical designer thus can quickly become aware of this problem, before the physical designer next works on the actual physical design for the electronic device.

The logical designer may correct this in one of a number of different ways. The logical designer may on the schematic 208 within the logical window 202 switch the logical connections 310 so that one of the logical connections 310 connects the output pin 306A to the input pin 308B and the other connects the output pin 306B to the input pin 308A. This change would be automatically and in real-time mirrored to and reflected in the simplified view 212 of the simplified window 206. The logical designer can also on the simplified view 212 of the simplified window 206 switch the rat lines 310' so that one of the rat lines 310' connects the output pin 306A' to the input pin 308B' and the other connects the output pin 306B' to the input pin 308A'. This change would be automatically and in real-time mirrored to and reflected in the schematic 208 of the logical window 202. In either case, the changes are automatically made to the logical design for the electronic device, regardless of whether the logical designer works in the simplified window 206 or in the logical window 202.

FIG. 3B shows another way by which the logical designer can correct the crossing rat lines 310'. In the simplified window 206, the logical designer has modified the shape of the rat line 310B' on the simplified view 212 so that it no longer crosses the rat line 310A'. The logical designer could have modified the shape of the rat line 310A' instead so that the rat lines 310' no longer cross. In either case, there is no actual change to the design of the electronic device. That is, no change is mirrored back to the logical design of the electronic device on the schematic 208 within the logical window 202. Rather, after modifying the shape of the rat line 310B' (or of the rat line 310A'), the logical designer may save the simplified view 212 within the simplified window 206 for subsequent reference by the physical designer when working on the physical device of the electronic device.

In the particular example of FIG. 3B, by saving the simplified view 212 as displayed, the logical designer is informing the physical designer that he or she is aware of the problem of the crossing rat lines 310', and would like for the physical designer to correct this issue by keeping the rat line 310A' more direct and by lengthening or otherwise changing the shape of the rat line 310B'. The actual shape of the conductive trace that the physical designer employs to realize this proposal can and likely will deviate from that of the rat line 310B' in FIG. 3B. That is, the purpose of the shape modification of the rat line 310B' within the simplified view 212 of the simplified window 206 by the logical designer is not to provide or convey the actual and specific shape of the rat line 310B'. Rather, the purpose is to convey the information that the rat line 310B' (as opposed to the rat line 310A', for instance) should have its shape changed to correct the crossing problem. The logical designer is not actually changing the physical design of the electronic device by modifying the shape of the rat line 310B' in FIG. 3B; the physical design remains the province of the physical designer working within the physical window 204.

FIG. 4 shows an example method 400, from the perspective of the real-time software that displays the simplified window 206. Parts 402, 404, 406, and 408 are operative when at least the real-time software and the logical design software, which displays the logical window 202, are running. Parts 410, 412, 414, and 416 are operative when at least the real-time software and the physical design software, which displays the physical window 204, are running.

In parts 402, 404, 406, and 408, the real-time software receives, from the logical design software, a change made to the design for an electronic device on the schematic 208 within the logical window 202 by a user like a logical designer (402). The real-time software correspondingly displays—automatically and in real-time—the change on the simplified view 212 of the circuit board representation within the simplified window 206 (404). The logical designer or another user can also make a change to the simplified view 212 of the simplified window 206 using the real-time software (406), which the real-time software sends to the logical design software for committing to (i.e., making on) the logical design for the electronic device (408).

In parts 410, 412, 414, and 416, the real-time software receives, from the physical design software, a change made to the design for an electronic device on the circuit board representation 210 within the physical window 204 by a user like a physical designer (410). The real-time software correspondingly displays—automatically and in real-time—the change on the simplified view 212 of the circuit board representation within the simplified window 206 (412). The physical designer or another user can also make a change to the simplified view 212 of the simplified window 206 using the real-time software (406), which the real-time software sends to the physical design software for committing to (i.e., making on) the physical design for the electronic device (416).

Figure 5:
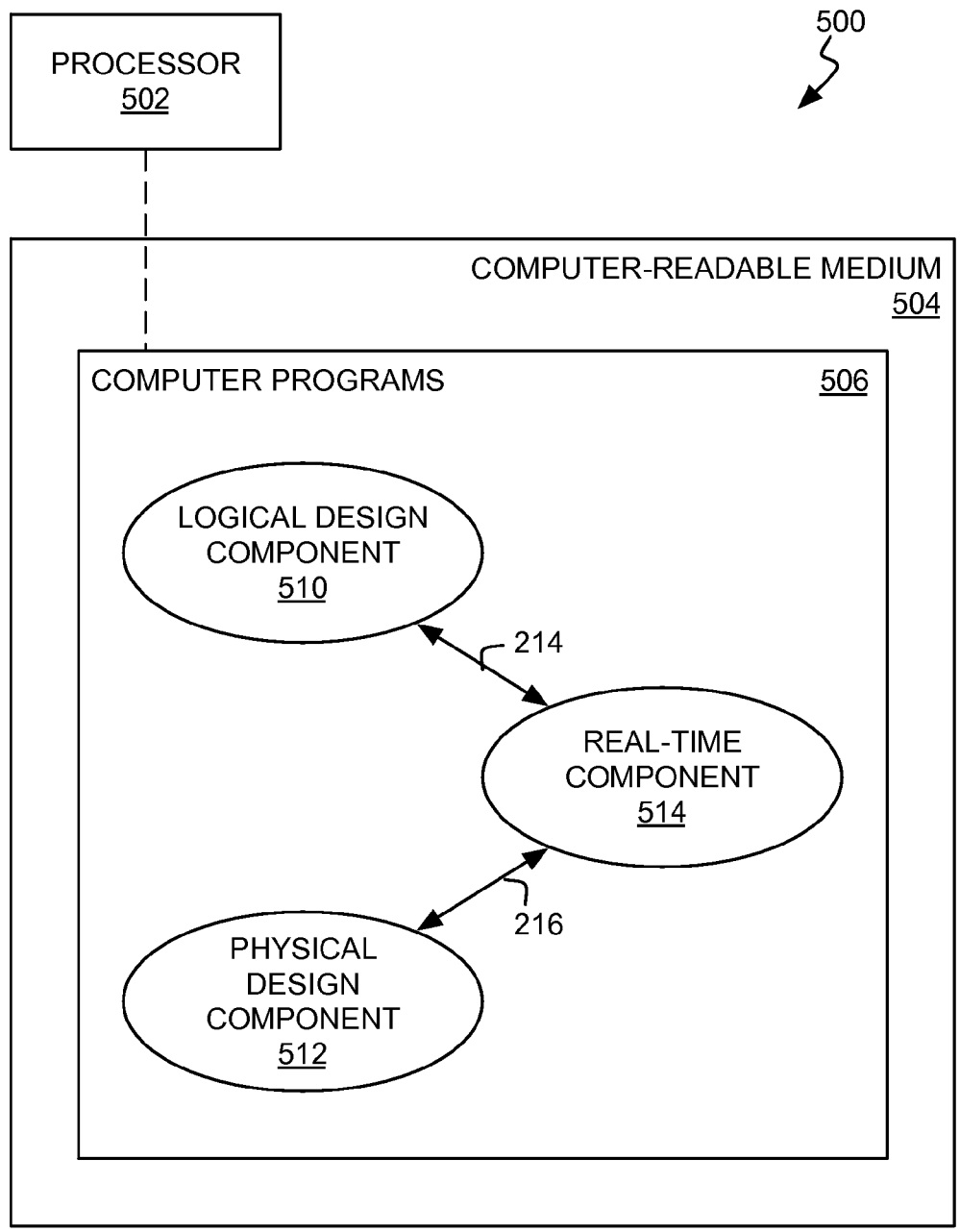
FIG. 5 is a diagram of an example system in which changes made to an electronic device design logically and/or physically are automatically displayed in real-time within a simplified window of a simplified view of a circuit board representation of the design, and vice-versa.

FIG. 5 shows an example rudimentary system 500. The system 500 includes a processor 502 and a computer-readable medium 504 that are interconnected to one another, among other types of hardware. The computer-readable medium 504 stores one or more computer programs 506 that are executable by the processor 502, as indicated by the dotted line 508.

The computer programs 506 implement one or more of a logical design component 510 and a physical design component 512. The computer programs 506 also implement a real-time component 514. The components 510, 512, and 514 may be separate computer programs, or part of the same computer program, and are software. The logical design component 510 displays the logical window 202 and performs the functionality associated with the logical design of an electronic device that has been described. The physical design component 512 displays the physical window 204 and performs the functionality associated with the physical design of an electronic device that has been described. The real-time component 514 displays the simplified window 206 and performs the functionality associated therewith as has been described. The components 510 and 514 interact with each another, as indicated by the bi-directional arrow 214, and likewise the components 512 and 514 interact with each other, as indicated by the bi-directional arrow 216.

The system 500 can be implemented over one or more computing devices, such as computers like desktop and laptop computers. For example, two or more such computing devices may be communicatively connected via a network. There may further be more than one instance of the real-time component 514 running on each such computing device. In one contemplated implementation, for instance, a first computing device runs the logical design component 510 and a first instance of the real-time component 514, and a second computing device runs the physical design component 512 and a second instance of the real-time component 514. In this implementation, a logical designer can use the first computing device to design the electronic device from a logical perspective, whereas a physical designer can use the second computing device to design the device from a hardware or circuit board perspective.

It is noted that, as can be appreciated by one those of ordinary skill within the art, aspects of the present invention may be embodied as a system, method or computer program product. Accordingly, aspects of the embodiments of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

In general, a computer program product includes a computer-readable medium on which one or more computer programs are stored. Execution of the computer programs from the computer-readable medium by one or more processors of one or more hardware devices causes a method to be performed. For instance, the method that is to be performed may be one or more of the methods that have been described above.

The computer programs themselves include computer program code. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is finally noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

I claim:

1. A system comprising:
hardware, including a processor;
a computer-readable data storage medium to store one or more computer programs executable by the hardware;
one or more of:
 (a) a logical design component implemented by the computer programs to permit a design of an electronic device to be modified from a logical perspective on a schematic of the electronic device showing components of the electronic device in logical form, the logical design component to display a logical window of the schematic within which the design is modifiable;
 (b) a physical design component implemented by the computer programs to permit the design of the electronic device to be modified from a circuit board perspective on a circuit board representation of the electronic device showing the components of the electronic device in physical form, the physical design component to display a physical window of the circuit board representation within which the design is modifiable, such that one or more windows of the logical window and the physical window are displayed; and a real-time component implemented by the computer programs to permit the design of the electronic device to be virtually modified from a simplified circuit board perspective on a simplified view of the circuit board representation of the electronic device, the real-time component to display a simplified window of the simplified view of the circuit board representation within which the design virtually is modifiable, wherein changes made to the design of the electronic device within the one or more windows of the logical window and the physical window are automatically displayed within the simplified window in real-time, and virtual changes made to the design within the simplified window are automatically displayed within the one or more windows in real-time, wherein the virtual changes made to the design within the simplified window using the real-time component are not in actuality automatically made to the circuit board representation of the electronic device, but rather are just virtually depicted in the simplified window, the circuit board representation still having to be correspondingly updated in accordance with the virtual changes using the physical design component.

2. The system of claim 1, wherein the one or more of the logical design component and the physical design component comprises both the logical design component and the physical design component, such that the logical window, the physical window, and the simplified window are displayed, wherein changes made to the design of the electronic device within the logical window are not automatically displayed within the physical window in real-time, and changes made to the design within the physical window are not automatically displayed within the logical window in real-time.

3. The system of claim 1, wherein the one or more of the logical design component and the physical design component comprises the logical design component, such that at least the logical window and the simplified window are displayed.

4. The system of claim 3, wherein a pin of the design of the electronic device selected on the schematic within the logical window results in the pin of the design being automatically selected on the simplified view of the circuit board representation within the simplified window in real-time.

5. The system of claim 3, wherein a logical connection made on the schematic of the design of the electronic device within the logical window results in a rat line being displayed on the simplified view of the circuit board representation within the simplified window in real-time.

6. The system of claim 5, wherein a shape of the rat line is modifiable on the simplified view of the circuit board representation within the simplified window in real-time.

7. The system of claim 3, wherein a rat line being added to the simplified view of the circuit board representation within the simplified window results in a logical connection being automatically made to the schematic of the design of the electronic device within the logical window in real-time.

8. The system of claim 3, wherein the one or more of the logical design component and the physical design component further comprises the physical design component, wherein the simplified view of the circuit board representation displayed on the simplified window is saved during modification of the design of the electronic device on the schematic within the logical window, and wherein the design of the electronic device is modified on the circuit board representation within the physical window with reference to the simplified view of the circuit board representation that has been saved.

9. The system of claim 8, wherein the simplified view of the circuit board representation that has been saved is referenced during modification of the design of the electronic device on the circuit board representation within the physical window to determine how to route traces on the circuit board representation.

10. The system of claim 1, wherein the simplified view of the circuit board representation displayed within the simplified window comprises a two-dimensional simplified view of the circuit board representation.

11. The system of claim 1, wherein the simplified view of the circuit board representation displayed within the simplified window comprises a three-dimensional simplified view of the circuit board representation.

12. A computer program product comprising:

a non-transitory computer-readable storage medium having computer-readable code embodied therein, executable by a computing device, and comprising one or more of:

first computer-readable code to receive from a logical design computer program a first change to a design of an electronic device made on a schematic of the electronic device within a logical window displayed by the logical design computer program and showing components of the electronic device in logical form, to automatically and in real-time display the first change within a simplified window of a simplified view of a circuit board representation of the electronic device, and to send to the logical design computer program a second change to the design of the electronic device made on the simplified view of the circuit board representation within the simplified window; and second computer-readable code to receive from a physical design computer program a third change to the design of the electronic device made on the circuit board representation within a physical window displayed by the physical design computer program and showing the components of the electronic device in physical form, to automatically and in real-time display the third change within the simplified window of the simplified view of the circuit board representation, and to send to the physical design computer program the second change to the design of the electronic device made on the simplified view of the circuit board representation within the simplified window, wherein the second change made to the design within the simplified window is a virtual change that is not in actuality automatically made to the circuit board representation of the electronic device, but rather is just virtually depicted in the simplified window, the circuit board representation still having to be correspondingly updated in accordance with the second change using the physical design computer program.

13. The computer program product of claim 12, wherein the one or more of the first, computer-readable code and the second computer-readable code comprises the first computer-readable code, such that at least the logical window and the simplified window are displayed.

14. The computer program product of claim 13, wherein one or more of:

a pin of the design of the electronic device selected on the schematic within the logical window results in the pin of the design being automatically selected on the simplified view of the circuit board representation within the simplified window in real-time;

a logical connection made on the schematic of the design of the electronic device within the logical window results in a rat line being displayed on the simplified view of the circuit board representation within the simplified window in real-time;

a rat line being added to the simplified view of the circuit board representation within the simplified window results in a logical connection being automatically made to the schematic of the design of the electronic device within the logical window in real-time.

15. The computer program product of claim 13, wherein the one or more of the first computer-readable code and the second computer-readable code further comprises the second computer-readable code, wherein the simplified view of the circuit board representation displayed on the simplified window is saved during modification of the design of the electronic device on the schematic within the logical window, and wherein the design of the electronic device is modified on the circuit board representation within the physical window with reference to the simplified view of the circuit board representation that has been saved.

16. The computer program product of claim 12, wherein the simplified view of the circuit board representation displayed within the simplified window comprises a two-dimensional simplified view of the circuit board representation.

17. The computer program product of claim 12, wherein the simplified view of the circuit board representation displayed within the simplified window comprises a three-dimensional simplified view of the circuit board representation.

18. A method comprising:

receiving a first change made to a design of an electronic device on a schematic of the electronic device within a logical window displayed by a logical design component and showing components of the electronic device in logical form, by a computing device;

automatically and in real-time displaying the first change within a simplified window of a simplified view of a circuit board representation of the electronic device, by the computing device; and sending to the logical design component a second change to the design of the electronic device made on the simplified view of the circuit board representation within the simplified window, by the computing device, wherein the second change made to the design within the simplified window is a virtual change that is not in actuality automatically made to the circuit board representation of the electronic device, but rather is just virtually depicted in the simplified window, the circuit board representation still having to be correspondingly updated in accordance with the second change using a physical design computer component.

19. The method of claim 18, further comprising:

receiving a third change to the design of the electronic device made on the circuit board representation within a physical window displayed by physical design component and showing the components of the electronic device in physical form, by the computing device;

automatically and in real-time displaying the third change within the simplified window of the simplified view of the circuit board representation, by the computing device; and sending to the physical design component a fourth change to the design of the electronic device made on the simplified view of the circuit board representation within the simplified window.

* * * * *

UNITED STATES PATENT AND TRADEMARK OFFICE
CERTIFICATE OF CORRECTION

PATENT NO. : 8,819,604 B2  
APPLICATION NO. : 13/745837  
DATED : August 26, 2014  
INVENTOR(S) : Jian Meng Page 1 of 1

It is certified that error appears in the above-identified patent and that said Letters Patent is hereby corrected as shown below:

Title Page

(72) in the inventors, Jian Ming should be:

-- Jian Meng --

Signed and Sealed this
Second Day of June, 2015

Michelle K. Lee
*Director of the United States Patent and Trademark Office*